United States Patent [19]
Virga et al.

[11] Patent Number: 5,461,196
[45] Date of Patent: Oct. 24, 1995

[54] LOW TEMPERATURE CO-FIRED CERAMIC (LTCC) HIGH DENSITY INTERCONNECT PACKAGE WITH CIRCUITRY WITHIN THE CAVITY WALLS

[75] Inventors: Kathleen Virga, Redondo Beach; Terry Cisco, Glendale; Joseph N. Owens, Santa Monica; Craig Shoda, Torrance, all of Calif.

[73] Assignee: Hughes Aircraft Company, Los Angeles, Calif.

[21] Appl. No.: 984,401

[22] Filed: Dec. 2, 1992

[51] Int. Cl.$^6$ ........................................ H01L 23/02
[52] U.S. Cl. .................... 174/52.4; 257/700; 361/735
[58] Field of Search ........................ 174/52.4, 50, 51, 174/52.1, 52.3; 156/632; 333/238; 361/735, 746, 790; 257/700, 701, 703, 774

[56] References Cited

U.S. PATENT DOCUMENTS

| | | | |
|---|---|---|---|
| 5,150,088 | 9/1992 | Virga | 333/238 |
| 5,227,583 | 7/1993 | Jones . | |
| 5,254,871 | 10/1993 | Benavides et al. | 257/666 |
| 5,255,430 | 10/1993 | Tallausen | 29/827 |
| 5,331,204 | 7/1994 | Kuroda et al. | 257/758 |

OTHER PUBLICATIONS

"Development of a LowTemperature Co-fired Multilayer Ceramic Technology", W. A. Vitriol et al., 1983 ISHM Proceedings, pp. 493–598.

"Processing and Reliability of Resistors Incorporated Within Low Temperature Co-fired Ceramic Structures", R. G.Pond et al., 1986 ISHM Proceedings, pp. 461–472.

"Low Temperature Co-Fireable Ceramics with Co-Fired Resistors", H. T. Sawhill, et al., 1986 ISHM Proceedsings, pp. 268–271.

Primary Examiner—Leo P. Picard
Assistant Examiner—Christopher Horgan
Attorney, Agent, or Firm—Leonard A. Alkov; W. K. Denson-Low

[57] ABSTRACT

A unitized integrally fused multilayer circuit package having a substrate, walls disposed on the substrate to form a central circuit package cavity, and circuit traces contained in the walls.

10 Claims, 3 Drawing Sheets

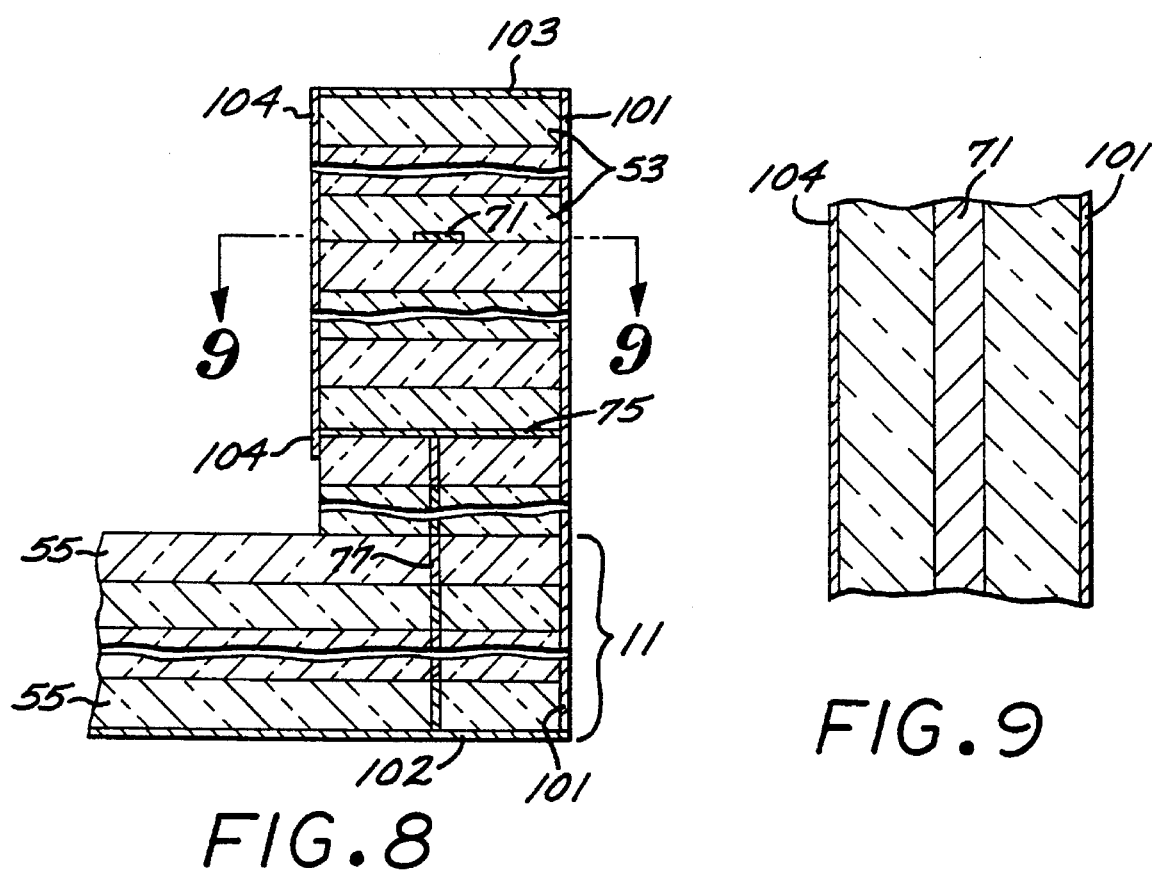

LOW TEMPERATURE CO-FIRED CERAMIC (LTCC) HIGH DENSITY INTERCONNECT PACKAGE WITH CIRCUITRY WITHIN THE CAVITY WALLS

BACKGROUND OF THE INVENTION

The subject invention is directed generally to unitized multilayer circuit structures, and more particularly to a unitized multilayer circuit package having signal carrying circuits in the walls thereof.

Unitized multilayer circuit packages are utilized to house and interconnect circuit devices such as integrated circuits, and can be formed from a plurality of integrally fused insulating layers (e.g., ceramic layers). For example, a unitized multilayer circuit package can include a plurality of layers that form a base portion, and walls disposed over the base portion that define a central cavity overlying the base portion. The base portion typically contains interconnect traces and circuit elements disposed between the layers thereof, and can also contain cavities formed in the top surface thereof for containing circuit devices being interconnected. The unitized multilayer circuit package is readily made into a DC and RF electrically shielded package by depositing conductive metallization on the top of the side walls, the sides of the circuit package, and on the bottom of the circuit package, and then conductively bonding a conductive cover plate onto the top of the side walls. The electrically shielded packages allow the placement of such packages next to each other and eliminates the need to place unitized circuit packages in an additional housing for electrical shielding.

A consideration with known unitized multilayer circuit structures is the continual need for higher interconnect density.

SUMMARY OF THE INVENTION

It would therefore be an advantage to provide a unitized multilayer circuit package that provides for increased interconnect density.

The foregoing and other advantages are provided by the invention in a unitized integrally fused multilayer circuit package having a substrate, walls disposed on the substrate to form a central circuit package cavity, and circuit traces contained in the walls.

BRIEF DESCRIPTION OF THE DRAWINGS

The advantages and features of the disclosed invention will readily be appreciated by persons skilled in the art from the following detailed description when read in conjunction with the drawing wherein:

FIG. 8 is a schematic elevational sectional view of another stripline circuit that can incorporated into one of the walls of the co-fired ceramic circuit package of FIG. 1.

FIG. 9 is a schematic plan sectional view of the stripline circuit of FIG. 8.

DETAILED DESCRIPTION OF THE DISCLOSURE

Figure 1:
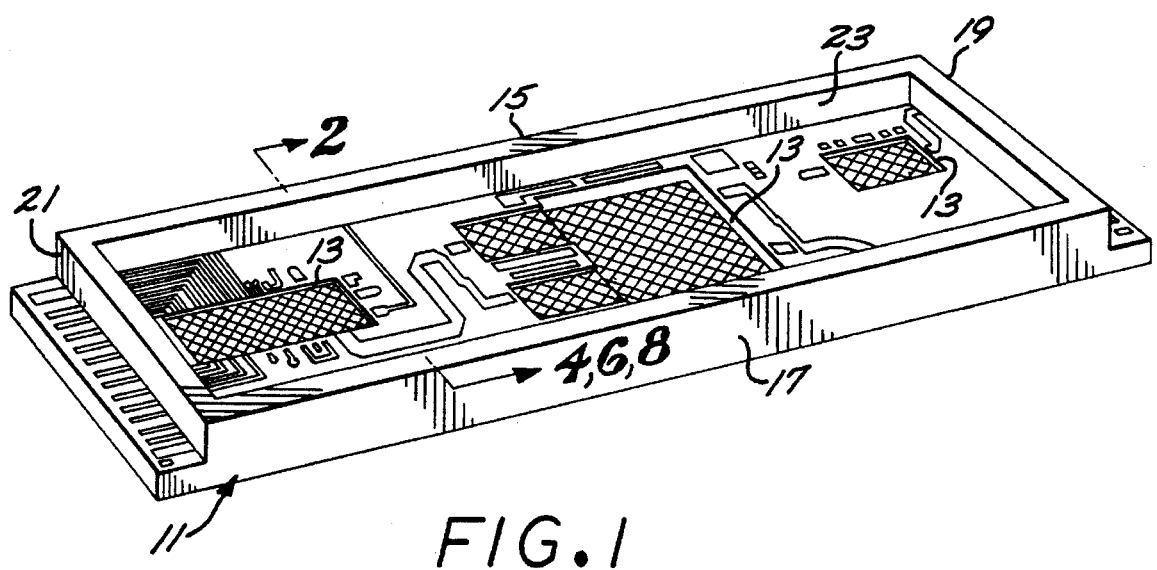
FIG. 1 is a schematic perspective of a co-fired ceramic circuit package that incorporates circuitry in its walls in accordance with the invention.

In the following detailed description and in the several figures of the drawing, like elements are identified with like reference numerals.

Referring now to FIG. 1, schematically set forth therein is a schematic perspective of a co-fired ceramic circuit package that incorporates circuitry in its walls in accordance with the invention. The circuit package generally includes a substrate or base 11 which can include one or more cavities 13 formed in the top portion thereof. The circuit package further includes four side walls 15, 17, 19, 21 arranged in a rectangle and forming a central cavity 23 that overlies the cavities 13 formed in the top portion of the base 11. The longer side walls 15, 17 are adjacent respective peripheral sides of the base 11 with their outside surfaces substantially aligned with the adjacent outside surfaces of the base 11. The shorter side walls 19, 21 are recessed inwardly from the short vertical surfaces of the base 11, so as to allow for external access to conductive traces 23 disposed on the terminal portions of the base 11 that extend beyond the shorter side walls 19, 21.

The circuit package comprised of the substrate 11 and the side walls 15, 17, 19, 21 is constructed of a plurality of insulating layers, such as ceramic tape for example, which are formed, laminated and co-fired to form an integrally fused unitized multilayer structure. In accordance with known techniques, conductive vias are formed in the layers of the base 11 and conductive traces and buried circuit elements are formed on selected layers of the base 11 prior to firing. Such conductive traces can include conductive traces that are exposed for connection on the ends of the substrate as well as within the cavities 13 and the central cavity 23. The devices being interconnected by the package are contained in the cavities 13, and circuit traces on the tops of the circuit devices can be wire bonded to traces on the exposed layer of the base 11. The central cavity comprises an air region that has sufficient vertical extent to eliminate RF interaction between (a) a conductive cover (not shown) that is conductively bonded to the top of the side walls and (b) any non-shielded microstrip lines that are on the exposed layer of the base 11.

Figure 2:
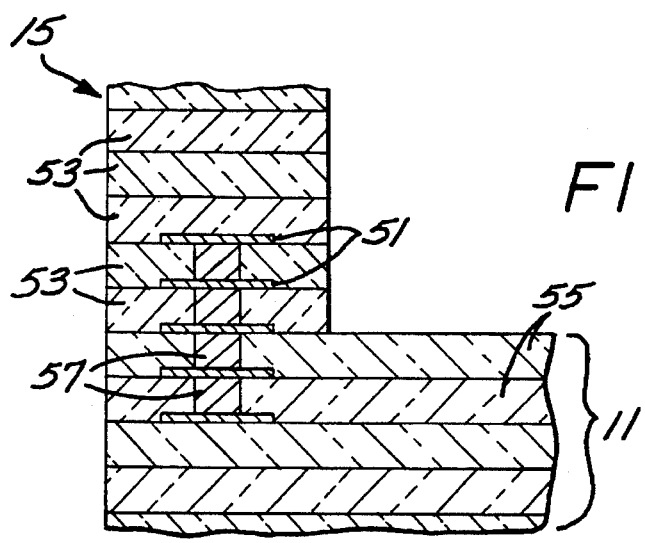
FIG. 2 is a schematic elevational sectional view of a DC interconnect structure that can incorporated into one of the walls of the co-fired ceramic circuit package of FIG. 1.
Figure 3:
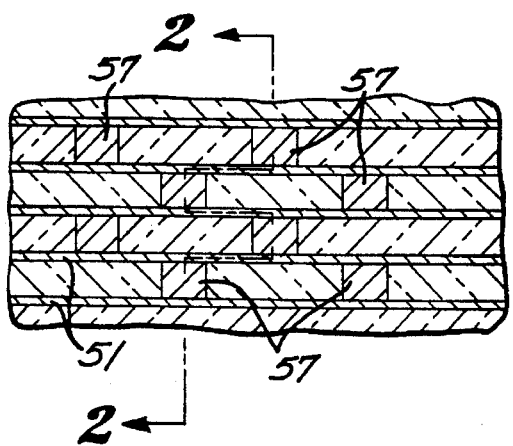
FIG. 3 is a schematic plan sectional view of the DC interconnect structure of FIG. 2.

Referring now to FIGS. 2 and 3, set forth therein is a DC interconnect structure in accordance with the invention that includes a plurality of conductive traces 51 disposed in a stack between layers 53 of the long side wall 15 of the circuit package of FIG. 1, for example, and layers 55 of the base 11. The conductive traces 51 of the DC interconnect structure extend along at least a portion of the long side wall 15 and are interconnected by rows of conductive vias 57 which are spaced along the lengths of the conductive traces. The conductive vias 57 can be staggered from one layer to the next, or they can be axially aligned to form via columns that extend through the stack of conductive traces 51, for example, depending on factors such as those affecting the electrical, thermal, or mechanical integrity of the unitized multilayer circuit package.

By way of illustrative example, the conductive trace 51 of the DC interconnect structure that is on the top layer of the base 11 that extends outwardly beyond the short side walls 19, 21 can extend to one or both of the terminal portions of the base 11 so as to be accessible for external connection.

The foregoing DC interconnect structure provides a low resistance, high current path as a result of utilizing a stack of conductive traces and interconnecting conductive vias. Such low resistance, high current path is conventionally achieved by a single wider DC line that would be too wide for implementation in one of the side walls of the circuit package, and thus the DC interconnect structure of the invention provides a mechanism for efficient use of a side wall to contain a circuit that would otherwise utilize area on or in the base 11.

Figure 4:
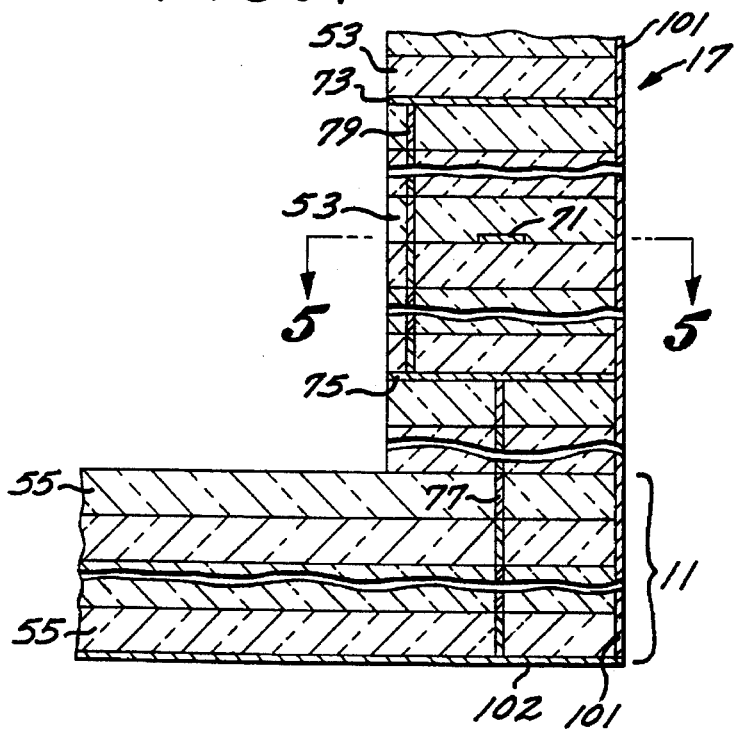
FIG. 4 is a schematic elevational sectional view of a stripline circuit that can incorporated into one of the walls of the co-fired ceramic circuit package of FIG. 1.
Figure 5:
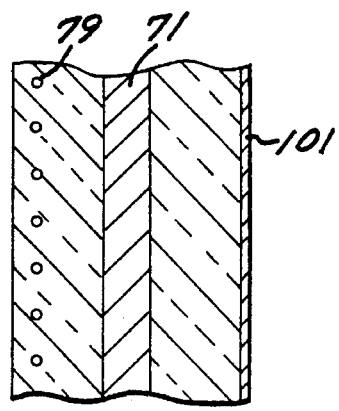
FIG. 5 is a schematic plan sectional view of the stripline circuit of FIG. 4.

Referring now to FIGS. 4 and 5, set forth therein is a stripline structure in accordance with the invention that includes a stripline conductor 71 disposed between layers of the long side wall 17 of the circuit package of FIG. 1 and extending along a portion of the long side wall 17. An embedded upper ground plane 73 is disposed above the stripline conductor between layers 53 of the long side wall 17 containing the stripline conductor 71 and appropriately separated therefrom by intervening insulating layers of the long side wall 17; and an embedded lower ground plane metallization layer 75 is disposed below the stripline conductor 71 between layers 53 of the long side wall 17 and appropriately separated therefrom by intervening insulating layers 53 of the side wall 17. Alternatively, the lower embedded ground plane 75 can be formed on one of the layers 55 of the base 11. The embedded ground planes 73, 75 extend to the outer perimeter of the circuit package and are in electrical contact with a side wall metallization 101 disposed on the outside wall of the circuit package that is adjacent the stripline conductor. The side wall metallization 101 extends downwardly to the bottom of the circuit package and is in contact with a bottom ground plane metallization layer disposed on the bottom of the circuit package. In this manner, the upper embedded ground plane, the lower embedded ground plane, and the bottom metallization layer ground plane are electrically connected together.

By way of illustrative example, the edges of the embedded ground planes adjacent the side wall metallization are castellated to maintain structural integrity. In particular, a castellated embedded metallization layer comprises plurality of separate non-metallized areas along an edge thereof that extend to the side wall metallization, which allows a plurality of areas of the two insulating layers above and below the metallization layer to be in contact along the perimeter of the circuit package, which in turn allows such two insulating layers to fuse to each other in the formation process. Electrical connection between the embedded metallization layer and the side wall metallization is achieved by metallized areas along the edge of the metallization layer which extend to the edges of the insulating layers above and below the metallization layer.

The lower embedded ground plane 75 is further electrically connected to the bottom ground plane metallization by conductive vias such as a row of conductive via columns 77. Each conductive via column 77 comprises a column of electrically connected vias formed in the insulating layers between the ground planes they are connecting, and can comprise axially aligned vias or staggered vias which are interconnected with conductor traces, for example. Whether axially aligned or staggered vias are utilized depends on factors such as those affecting the electrical, thermal or mechanical integrity of the unitized multilayer circuit structure.

The upper embedded ground plane 73 is further electrically connected to the lower embedded ground plane 75 a row of conductive via columns 79 which are on the side of the stripline conductor 71 that is adjacent the inner face of the side wall 17. Each conductive via column 79 comprises a column of electrically connected vias formed in the insulating layers between the ground planes they are connecting, and can comprise axially aligned vias or staggered vias which are interconnected with conductor traces, for example. Whether axially aligned or staggered vias are utilized depends on factors such as those affecting the electrical, thermal or mechanical integrity of the unitized multilayer circuit structure.

Figure 6:
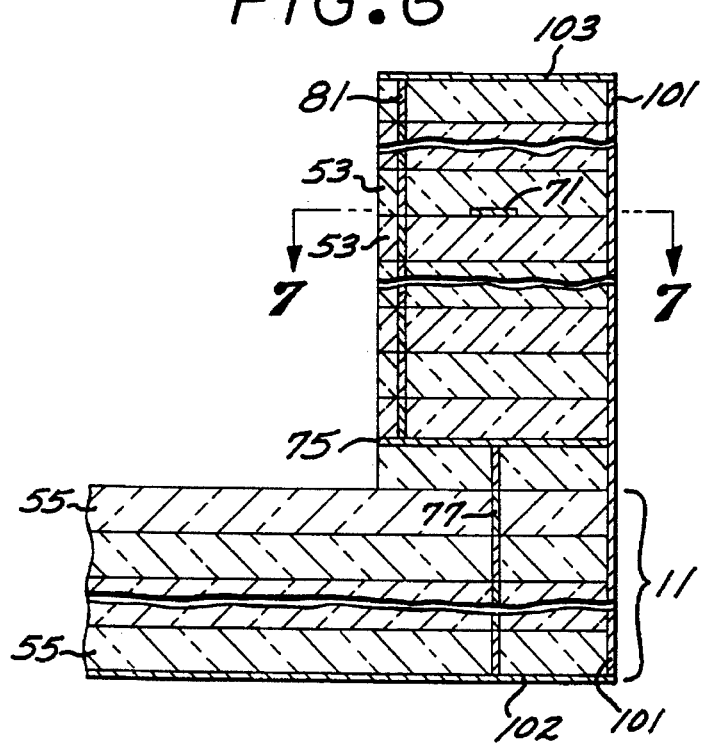
FIG. 6 is a schematic elevational sectional view of a further stripline circuit that can incorporated into one of the walls of the co-fired ceramic circuit package of FIG. 1.
Figure 7:
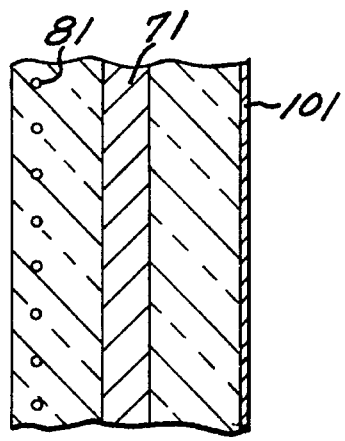
FIG. 7 is a schematic plan sectional view of the stripline circuit of FIG. 6.

Referring now to FIGS. 6 and 7, set forth therein is a further stripline structure in accordance with the invention which is similar to the stripline structure of FIGS. 4 and 5, except that a top metallization layer 103 disposed on the top of the side wall 17 is utilized as an upper ground plane of the stripline structure. Similarly to the stripline structure of FIGS. 4 and 5, the top metallization layer, the lower embedded metallization layer 75, and the bottom metallization ground plane are electrically connected together by the side wall metallization 101, a row of conductive via columns 81 which are on the side of the stripline conductor adjacent the inside face of the side wall 17 and extend from the top metallization layer 103 to the embedded ground plane 75 as well as to the bottom metallization 102, and the row of conductive via columns 77 extending between the embedded lower ground plane 75 and the bottom metallization ground plane 102.

Referring now to FIGS. 8 and 9, set forth therein is a further stripline structure in accordance with the invention which is similar to the stripline structure of FIGS. 7 and 8, except that an inner side wall metallization 104 disposed on the inside face of the side wall 17 is electrically connected between the top metallization 103 and the embedded lower ground plane 75.

In the stripline structures thus disclosed, the ground plane components above and below the stripline conductor, the outer side wall metallization, and the conductive via columns adjacent the stripline conductor or the inner side wall metallization form a stripline channel that encloses the stripline conductor along its length. These conductive elements surrounding the stripline conductor define a region about the stripline conductor and function to confine the stripline fields within that region in order to minimize the RF signal coupling to circuitry external to the region.

While the foregoing stripline structures have been described by way of example relative to a stripline conductor on a single layer, it should be appreciated that a stripline conductor can transition from one layer to another, in which case the embedded ground plane(s) can also be on multiple layers and appropriately interconnected by conductive vias.

Unitized multilayer circuit packages in accordance with the invention are made, for example, pursuant to low temperature co-fired processing such as disclosed in "Development of a Low Temperature Co-fired Multilayer Ceramic Technology," by William A. Vitriol et al., 1983 ISHM Proceedings, pages 593–598; "Processing and Reliability of Resistors Incorporated Within Low Temperature Co-fired Ceramic Structures," by Ramona G. Pond et al., 1986 ISHM Proceedings, pages 461–472; and "Low Temperature Co-Fireable Ceramics with Co-Fired Resistors," by H. T. Sawhill et al., 1986 ISHM Proceedings, pages 268–271.

In accordance with low temperature co-fired processing, vias are formed in a plurality of green thick film tape layers at locations defined by the desired via configurations of the desired multilayer circuit. The vias are filled with the appropriate fill material, for example, by screen printing. Conductor metallization for conductive traces including the stripline conductors and the embedded ground planes are then deposited on the individual tape layers by screen printing, for example, and materials for forming passive components are deposited on the tape layers. The tape layers are laminated and fired at a temperature below 1200 degrees Celsius (typically 850 degrees Celsius) for a predetermined length of time which drives off organic materials contained in the green ceramic tape and forms a solid ceramic substrate. External metallization including the lower ground plane metallization and any side wall metallization can then be applied by known techniques.

Circuit packages in accordance with the invention can also be implemented with other technologies for forming unitized multilayer circuit structures, including for example high temperature co-fired ceramics, hard ceramic multilayer single firing technology, and a laminated soft substrate approach.

Although the foregoing has been a description and illustration of specific embodiments of the invention, various modifications and changes thereto can be made by persons skilled in the art without departing from the scope and spirit of the invention as defined by the following claims.

What is claimed is:

1. A unitized multilayer circuit package comprising:
    a substrate comprised of stacked insulating layers and having a perimeter;
    a plurality of walls disposed on said substrate so as to form a cavity that is enclosed by the walls which are comprised of stacked insulating layers, each wall having two opposing sides;
    a stripline conductor disposed between two adjacent layers of a predetermined one of said walls and extending along a portion of said predetermined wall;
    an upper embedded ground plane metallization layer disposed between adjacent layers of said predetermined wall and spaced above said stripline by a plurality of insulating layers of said predetermined wall;
    a lower embedded ground plane metallization layer disposed below said stripline conductor between adjacent insulating layers and spaced from said stripline by a plurality of insulating layers;
    a bottom ground plane metallization layer formed on the bottom surface of the unitized multilayer circuit structure;
    a conductive layer disposed on one of said opposing sides of said predetermined wall for electrically connecting said upper embedded ground plane metallization layer, said lower embedded ground plane metallization layer, and said bottom ground plane metallization layer; and
    conductive means adjacent the other of said opposing walls and laterally spaced from said stripline for further electrically connecting said upper embedded ground plane to said lower embedded ground plane.

2. The multilayer circuit structure of claim 1 wherein conductive means comprises a row of conductive vias.

3. The multilayer circuit structure of claim 2 further including a further row of conductive vias for electrically connecting said lower embedded ground plane metallization layer to said bottom ground plane metallization layer.

4. The multilayer circuit structure of claim 1 wherein conductive means comprises a side wall metallization disposed on said other opposing side wall.

5. The multilayer circuit structure of claim 4 further including a further row of conductive vias for electrically connecting said lower embedded ground plane metallization layer to said bottom ground plane metallization layer.

6. A unitized multilayer circuit package comprising:
    a substrate comprised of vertically stacked insulating layers;
    a plurality of walls disposed on said substrate so as to form a cavity that is enclosed by the walls which are comprised of vertically stacked insulating layers, each wall having two opposing sides and a top;
    a stripline conductor disposed between two adjacent layers of a predetermined one of said walls and extending along a portion of said predetermined wall;
    a top metallization layer disposed on the top of said predetermined wall;
    a lower embedded ground plane metallization layer disposed below said stripline conductor between adjacent insulating layers and spaced from said stripline conductor by a plurality of insulating layers;
    a bottom ground plane metallization layer formed on the bottom surface of the unitized multilayer circuit structure;
    a conductive layer disposed on one of said opposing sides of said predetermined wall for electrically connecting said upper embedded ground plane metallization layer, said lower embedded ground plane metallization layer, and said bottom ground plane metallization layer; and
    conductive means adjacent the other of said opposing walls and laterally spaced from said stripline for further electrically connecting said upper embedded ground plane to said lower embedded ground plane.

7. The multilayer circuit structure of claim 6 wherein conductive means comprises a row of conductive vias.

8. The multilayer circuit structure of claim 7 further including a further row of conductive vias for electrically connecting said lower embedded ground plane metallization layer to said bottom ground plane metallization layer.

9. The multilayer circuit structure of claim 6 wherein conductive means comprises a side wall metallization disposed on said other opposing side wall.

10. The multilayer circuit structure of claim 9 further including a further row of conductive vias for electrically connecting said lower embedded ground plane metallization layer to said bottom ground plane metallization layer.

* * * * *